(12) United States Patent
Han

(10) Patent No.: US 11,127,475 B2
(45) Date of Patent: Sep. 21, 2021

(54) MEMORY DEVICE CONTROLLING OPERATING VOLTAGE OF SELECT TRANSISTOR AND METHOD OF OPERATING THE SAME

(71) Applicant: SK hynix Inc., Gyeonggi-do (KR)

(72) Inventor: Ju Hyeon Han, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/291,713

(22) Filed: Mar. 4, 2019

(65) Prior Publication Data
US 2020/0051646 A1   Feb. 13, 2020

(30) Foreign Application Priority Data
Aug. 13, 2018   (KR) .................. 10-2018-0094632

(51) Int. Cl.
| | | |
|---|---|---|
| *G11C 16/04* | (2006.01) | |
| *G11C 16/34* | (2006.01) | |
| *G11C 16/10* | (2006.01) | |
| *G11C 16/26* | (2006.01) | |
| *G11C 16/08* | (2006.01) | |
| *G11C 29/50* | (2006.01) | |
| *G11C 16/30* | (2006.01) | |

(52) U.S. Cl.
CPC ...... *G11C 16/3404* (2013.01); *G11C 16/0483* (2013.01); *G11C 16/08* (2013.01); *G11C 16/10* (2013.01); *G11C 16/26* (2013.01); *G11C 16/30* (2013.01); *G11C 29/50004* (2013.01); *G11C 2216/14* (2013.01)

(58) Field of Classification Search
CPC ............... G11C 16/3404; G11C 16/30; G11C 29/50004; G11C 16/0483; G11C 16/08; G11C 16/26; G11C 16/10; G11C 2216/14
USPC ..................................... 365/185.12
See application file for complete search history.

(56) References Cited

U.S. PATENT DOCUMENTS

| | | | |
|---|---|---|---|
| 2012/0327713 A1* | 12/2012 | Parat .................. | G11C 29/765 365/185.17 |
| 2014/0293702 A1* | 10/2014 | Dong .................... | G11C 16/10 365/185.17 |
| 2015/0063036 A1* | 3/2015 | Kamigaichi ........... | G11C 16/10 365/185.22 |
| 2015/0262682 A1* | 9/2015 | Futatsuyama ....... | G11C 11/5671 365/185.22 |

FOREIGN PATENT DOCUMENTS

| | | |
|---|---|---|
| KR | 10-2010-0054566 | 5/2010 |
| KR | 10-2015-0073718 | 7/2015 |

(Continued)

*Primary Examiner* — Tha-O H Bui
(74) *Attorney, Agent, or Firm* — IP & T Group LLP

(57) ABSTRACT

Provided herein may be a memory device and a method of operating the same. The memory device may include: a memory block including a plurality of select transistors; a peripheral circuit configured to perform a program operation and a read operation on the memory block; and control logic configured to control the peripheral circuits to perform the program operation and the read operation, and to adjust and set a potential level of a select transistor operating voltage to be applied to the plurality of select transistors based on a threshold voltage monitoring operation on the plurality of select transistors.

12 Claims, 10 Drawing Sheets

(56) References Cited

FOREIGN PATENT DOCUMENTS

| KR | 10-2016-0086474 | 7/2016 |
| KR | 10-2017-0037159 | 4/2017 |
| KR | 10-2017-0069756 | 6/2017 |
| KR | 10-2018-0025357 | 3/2018 |

* cited by examiner

MEMORY DEVICE CONTROLLING OPERATING VOLTAGE OF SELECT TRANSISTOR AND METHOD OF OPERATING THE SAME

CROSS-REFERENCE TO RELATED APPLICATION

The present application claims priority under 35 U.S.C. § 119(a) to Korean patent application number 10-2018-0094632, filed on Aug. 13, 2018, the entire disclosure of which is incorporated herein by reference in its entirety.

BACKGROUND

Field of Invention

Various embodiments of the present disclosure generally relate to an electronic device. Particularly, the embodiments relate to a memory device and a method of operating the same.

Description of Related Art

The computer environment paradigm has been shifting to ubiquitous computing, which enables computer systems to be used anytime and anywhere. As a result, the use of portable electronic devices such as mobile phones, digital cameras, and notebook computers has rapidly increased. In general, such portable electronic devices use a memory system which employs a memory device, in other words, use a data storage device. The data storage device is used as a main memory device or an auxiliary memory device of the portable electronic devices.

Since there is no mechanical driving part, a data storage device using a memory device provides advantages such as excellent stability and durability, high information access speed, and low power consumption. Examples of the data storage devices having such advantages may include a universal serial bus (USB) memory device, a memory card having various interfaces, and a solid state drive (SSD).

Memory devices are classified into volatile memory devices and nonvolatile memory devices.

A nonvolatile memory device can retain data stored therein even when power supply is interrupted, although read and write speeds are comparatively low. Therefore, a nonvolatile memory device is used when stored data must be retained regardless of whether or not the memory device is connected to a power supply. Representative examples of a nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). A flash memory may be a NOR type memory or a NAND type memory.

SUMMARY

Various embodiments of the present disclosure are directed to a memory device and a method of operating the same in which, depending on a threshold voltage distribution of select transistors, the level of voltage to be applied to each select transistor is set.

An embodiment of the present disclosure may provide for a memory device including: a memory block including a plurality of select transistors; a peripheral circuit configured to perform a program operation and a read operation on the memory block; and control logic configured to control the peripheral circuits to perform the program operation and the read operation, and to adjust and set a potential level of a select transistor operating voltage to be applied to the plurality of select transistors based on a threshold voltage monitoring operation on the plurality of select transistors.

An embodiment of the present disclosure may provide for a memory device including: a memory block including a plurality of select transistors; a peripheral circuit configured to perform a threshold voltage monitoring operation on the plurality of select transistors; and a control logic configured to control the peripheral circuits, and to reduce a select transistor operating voltage to be applied to the plurality of select transistors when a number of first select transistors in a lower threshold voltage distribution among the plurality of select transistors falls within a first setting range as a result of the threshold voltage monitoring operation, and increase the select transistor operation voltage when a number of second select transistors in an upper threshold voltage distribution among the plurality of select transistors falls within a second setting range.

An embodiment of the present disclosure may provide for a method of operating a memory device including: performing a first read operation using a first read voltage on a plurality of select transistors in a memory block; determining a number of first select transistors in a lower threshold voltage distribution area less than the first read voltage among the plurality of select transistors based on data read as a result of the first read operation; and reducing a potential level of a select transistor operating voltage to be applied to the plurality of select transistors when the number of first select transistors falls within a first setting range.

An embodiment of the present disclosure may provide for a memory device including: a memory block including a plurality of select transistors; a peripheral circuit configured to perform a first operation on the plurality of select transistors by providing the plurality of select transistors with an operating voltage, and to monitor a threshold voltage distribution on the plurality of select transistors based on the first operation; and control logic configured to adjust a potential level of the operating voltage based on the monitored threshold voltage distribution, and to control the peripheral circuit to perform a second operation on the plurality of select transistors based on the adjusted operating voltage.

DETAILED DESCRIPTION

Figure 1:
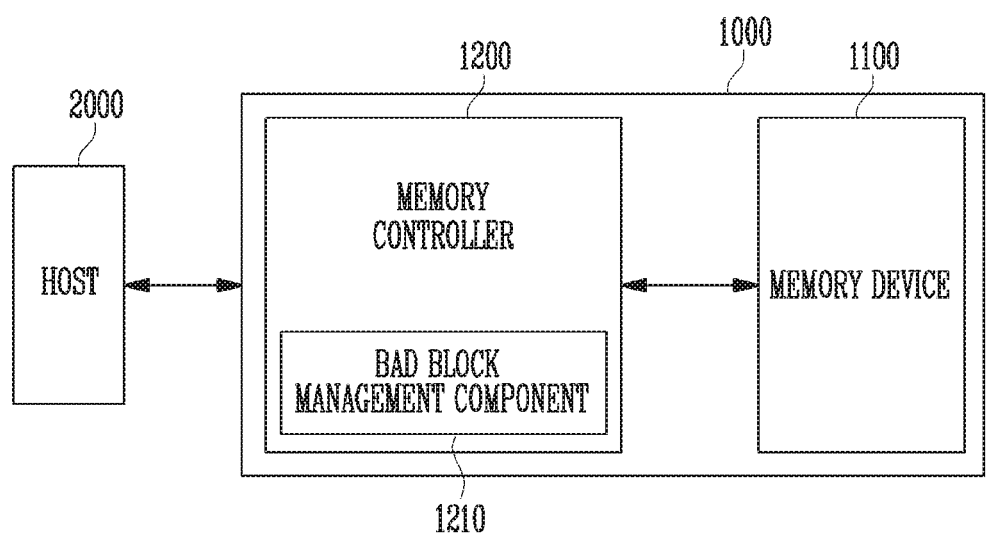
FIG. 1 is a diagram illustrating a memory system in accordance with an embodiment of the present disclosure.

Various embodiments will now be described more fully with reference to the accompanying drawings; however, elements and features of the present disclosure may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. Also, throughout the specification, reference to "an embodiment," "another embodiment" or the like is not necessarily to only one embodiment, and different references to any such phrase are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present.

Embodiments are described herein with reference to block, sectional and schematic illustrations of structures and intermediate structures. As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to identify but not limit various components. Those terms are used for the purpose of differentiating components having the same or substantially the same names. For example, a first component may be referred to as a second component and vice versa without departing from the spirit and scope of the present disclosure. Furthermore, "and/or" may include any one of or a combination of the components mentioned.

Furthermore, a singular form may include a plural form and vice versa, unless the context indicates otherwise. Furthermore, "include/comprise" or "including/comprising" used in the specification represents that one or more stated components, steps, operations, and/or elements exist or are added, but does not preclude the existence or addition of one or more other components, steps, operations and/or elements.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through one or more intermediate components. On the other hand, "directly connected/directly coupled" refers to one component directly coupling another component without any intermediate component. Communication between two elements, whether directly or indirectly connected/coupled, may be wired or wireless, unless the context indicates otherwise.

FIG. 1 is a diagram illustrating a memory system 1000 in accordance with an embodiment of the present disclosure.

Referring to FIG. 1, the memory system 1000 may include a memory device 1100 configured to store data, and a memory controller 1200 configured to control the memory device 1100 under control of a host 2000.

The host 2000 may communicate with the memory system 1000 using an interface protocol such as a peripheral component interconnect-express (PCI-e or PCIe) protocol, an advanced technology attachment (ATA) protocol, a serial ATA (SATA) protocol, a parallel ATA (PATA) protocol, or a serial attached SCSI (SAS) protocol. However, data communication between the host 2000 and the memory system 1000 is not limited to the foregoing examples; any one of various other interface protocols such as a universal serial bus (USB) protocol, a multi-media card (MMC) protocol, an enhanced small disk interface (ESDI) protocol, and an integrated drive electronics (IDE) protocol may be used.

The memory controller 1200 may control the overall operation of the memory system 1000 and data exchange between the host 2000 and the memory device 1100. For instance, the memory controller 1200 may control the memory device 1100 to program or read data in response to a request of the host 2000. Furthermore, the memory controller 1200 may control the memory device 1100 such that information is stored in main memory blocks and sub-memory blocks in the memory device 1100, and a program operation is performed on the main memory blocks or the sub-memory blocks depending on the amount of data loaded for the program operation. The memory controller 1200 may include a bad block management component 1210, which may receive bad block information from the memory device 1100, and update and store information about bad blocks of the plurality of memory blocks in the memory device 1100. The bad block management component 1210 may control the memory device 1100 to prevent bad blocks from being selected based on the stored bad block information during the overall operation of the memory device 1100. In an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), or a flash memory.

The memory device 1100 may perform a program operation, a read operation, or an erase operation under control of the memory controller 1200. Furthermore, the memory device 1100 may monitor a threshold voltage distribution of a plurality of select transistors (e.g., source select transistors, drain select transistors, and pipe transistors) in the memory blocks during run time, and may adjust and set operating voltages of the select transistors based on a result of the monitoring.

Figure 2:
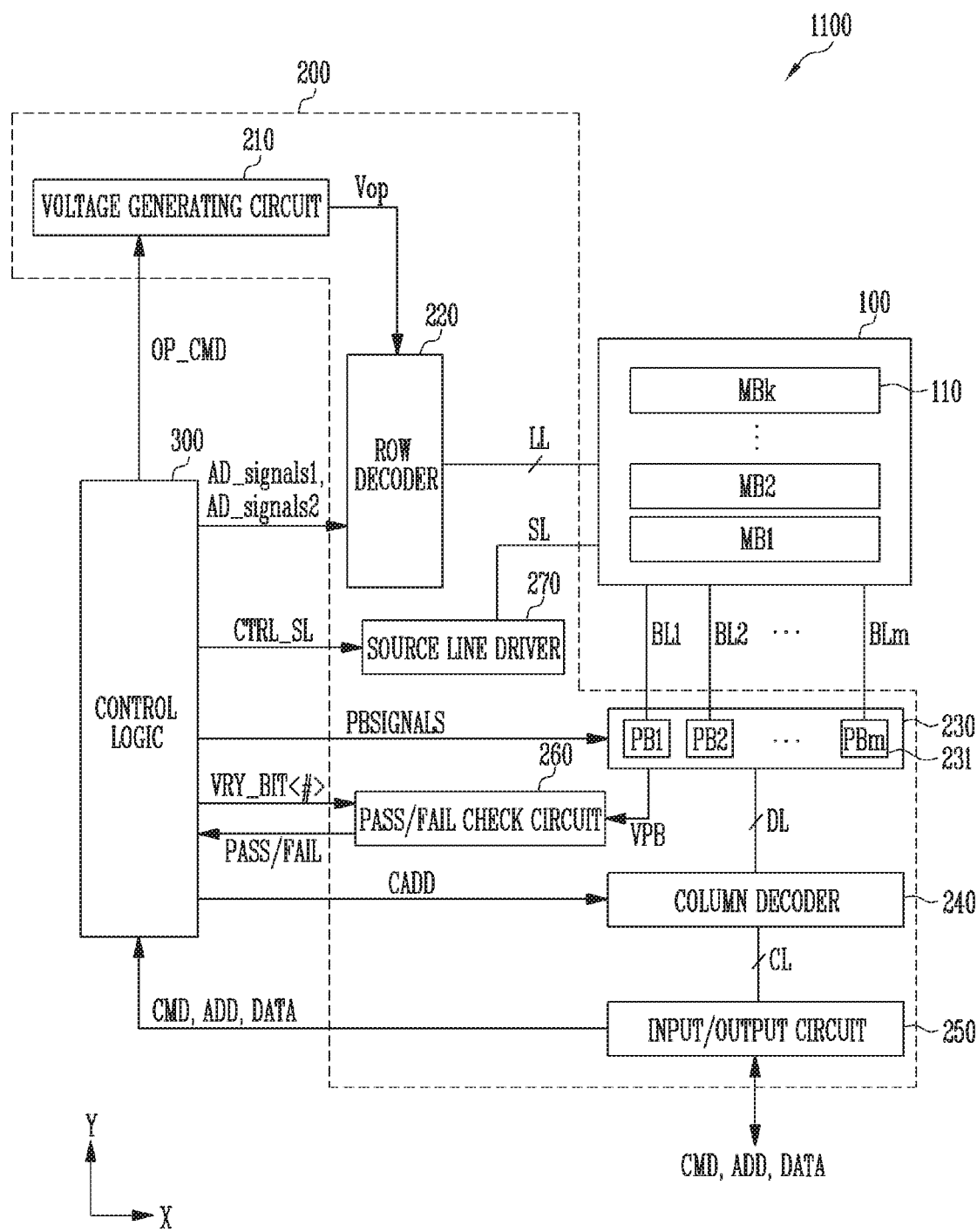
FIG. 2 is a diagram illustrating a memory device in accordance with an embodiment of the present disclosure.

FIG. 2 is a diagram illustrating a memory device, e.g, the memory device 1100 of FIG. 1, in accordance with an embodiment of the present disclosure.

Referring to FIG. 2, the memory device 1100 may include a memory cell array 100 configured to store data. The memory device 1100 may include a peripheral circuit 200 configured to perform a program operation for storing data in the memory cell array 100, a read operation for outputting the stored data, and an erase operation for erasing the stored data. The memory device 1100 may include control logic 300 configured to control the peripheral circuit 200 under control of a memory controller (e.g., the memory controller 1200 of FIG. 1). Furthermore, the memory device 1100 may monitor a threshold voltage distribution of select transistors in the memory cell array 100, and may adjust and set operating voltages of the select transistors based on a result of the monitoring.

The memory cell array 100 may include a plurality of memory blocks MB1 to MBk 110 (where k is a positive integer). Local lines LL and bit lines BL1 to BLm (where m is a positive integer) may be coupled to each of the memory blocks MB1 to MBk 110. For example, the local lines LL may include a first select line, a second select line, and a plurality of word lines arranged between the first and the second select lines. The local lines LL may include dummy lines arranged between the first select line and the word lines and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipelines. The local lines LL may be coupled to each of the memory blocks MB1 to MBk 110. The bit lines BL1 to BLm may be coupled in common to the memory blocks MB1 to MBk 110. The memory blocks MB1 to MBk 110 may be embodied in a two-dimensional (2D) or three-dimensional (3D) structure. For example, in the memory blocks 110 having a two-dimensional structure, the memory cells may be arranged in a direction parallel to a substrate. For instance, in the memory blocks 110 having a three-dimensional structure, the memory cells may be stacked in a direction perpendicular to the substrate.

The peripheral circuit 200 may perform a program operation, a read operation, or an erase operation on a selected memory block 110 under control of the control logic 300. For instance, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop to be used for a program operation, a read operation, and an erase operation in response to an operating signal OP_CMD. Furthermore, the voltage generating circuit 210 may selectively discharge the local lines LL in response to an operating signal OP_CMD. For example, the voltage generating circuit 210 may generate a program voltage, a verify voltage, a pass voltage, and an operating voltage of a select transistor under control of the control logic 300. Furthermore, the voltage generating circuit 210 may generate first and second read voltages to monitor threshold voltages of the select transistors. In an embodiment, the second read voltage is greater than the first read voltage.

The row decoder 220 may transmit operating voltages Vop to local lines WL coupled to a selected memory block 110 in response to row decoder control signals AD_signals1 and AD_signals2. For example, the row decoder 220 may selectively apply operating voltages (e.g., a program voltage, a verify voltage, a pass voltage, etc.) generated by the voltage generating circuit 210 to the word lines of the local lines LL in response to the row decoder control signals AD_signals1. Further, the row decoder 220 may selectively apply select transistor operating voltages generated by the voltage generating circuit 210 to the source select line, the drain select line, and the pipeline of the local lines LL in response to the row decoder control signals AD_signals2.

During a program voltage applying operation, in response to the row decoder control signals AD_signals1, the row decoder 220 may apply a program voltage generated by the voltage generating circuit 210 to a selected word line of the local lines LL. Further, the row decoder 220 may apply a pass voltage generated by the voltage generating circuit 210 to the other unselected word lines. During a read operation, in response to the row decoder control signals AD_signals1, the row decoder 220 may apply a read voltage generated by the voltage generating circuit 210 to a selected word line of the local lines LL. Further, the row decoder 220 may apply a pass voltage generated by the voltage generating circuit 210 to the other unselected word lines. Furthermore, during an operation of monitoring the threshold voltages of the select transistors, in response to the row decoder control signals AD_signals2, the row decoder 220 may selectively apply a first or second read voltage generated by the voltage generating circuit 210 to the source select line, the drain select line, and the pipeline of the local lines LL.

The page buffer group 230 may include a plurality of page buffers PB1 to PBm 231 coupled to the bit lines BL1 to BLm. The page buffers PB1 to PBm 231 may operate in response to page buffer control signals PBSIGNALS. For instance, the page buffers PB1 to PBm 231 may temporarily store data to be programmed during a program operation, or sense voltages or currents of the bit lines BL1 to BLm during a read or verify operation.

The column decoder 240 may transmit data between the input/output circuit 250 and the page buffer group 230 in response to a column address CADD. For example, the column decoder 240 may exchange data with the page buffers 231 through data lines DL or exchange data with the input/output circuit 250 through column lines CL.

The input/output circuit 250 may transmit a command CMD or an address ADD received from the memory controller 1200 (of FIG. 1) to the control logic 300, or exchange data with the column decoder 240. During an operation of monitoring the threshold voltages of the select transistors, the input/output circuit 250 may receive, through the column decoder 240, data read by the page buffer group 230, and transmit the received data to the control logic 300.

During a read or verify operation, the pass/fail check circuit 260 may generate a reference current in response to an enable bit VRY_BIT<#>. Further, the pass/fail check circuit 260 may compare a sensing voltage VPB received from the page buffer group 230 with a reference voltage generated by the reference current and output a pass signal PASS or a fail signal FAIL based on the comparison result.

The source line driver 270 may be coupled, through the source line SL, to the memory cells in the memory cell array 100, and may control a voltage to be applied to the source line SL. For example, the source line driver 270 may apply a positive source line voltage to the source line SL during a hole injection operation after a program verify operation. The source line driver 270 may receive a source line control signal CTRL_SL from the control logic 300, and control a source line voltage to be applied to the source line SL based on the source line control signal CTRL_SL.

The control logic 300 may control the peripheral circuit 200 by outputting an operating signal OP_CMD, row decoder control signals AD_signals1 and AD_signals2, page buffer control signals PBSIGNALS, and an enable bit VRY_BIT<#> in response to a command CMD and an address ADD. In addition, the control logic 300 may determine whether a target memory cell has passed a verification during a verify operation in response to a pass or fail signal PASS or FAIL. During an operation of monitoring the threshold voltages of the select transistors, the control logic 300 may determine a threshold voltage distribution according to data received from the input/output circuit 250, and set a select transistor operating voltage based on a result of the determination.

As described above, the memory device 1100 may monitor a threshold voltage distribution of the select transistors of a selected memory block before an overall operation such as a program operation or a read operation. Further, the memory device 1100 may adjust and set an operating voltage to be applied to the select transistors based on a result of the monitoring. Detailed operations of a method of monitoring the threshold voltage distribution of the select transistors and a method of adjusting and setting the operating voltage based on a result of the monitoring will be described later herein.

Figure 3:
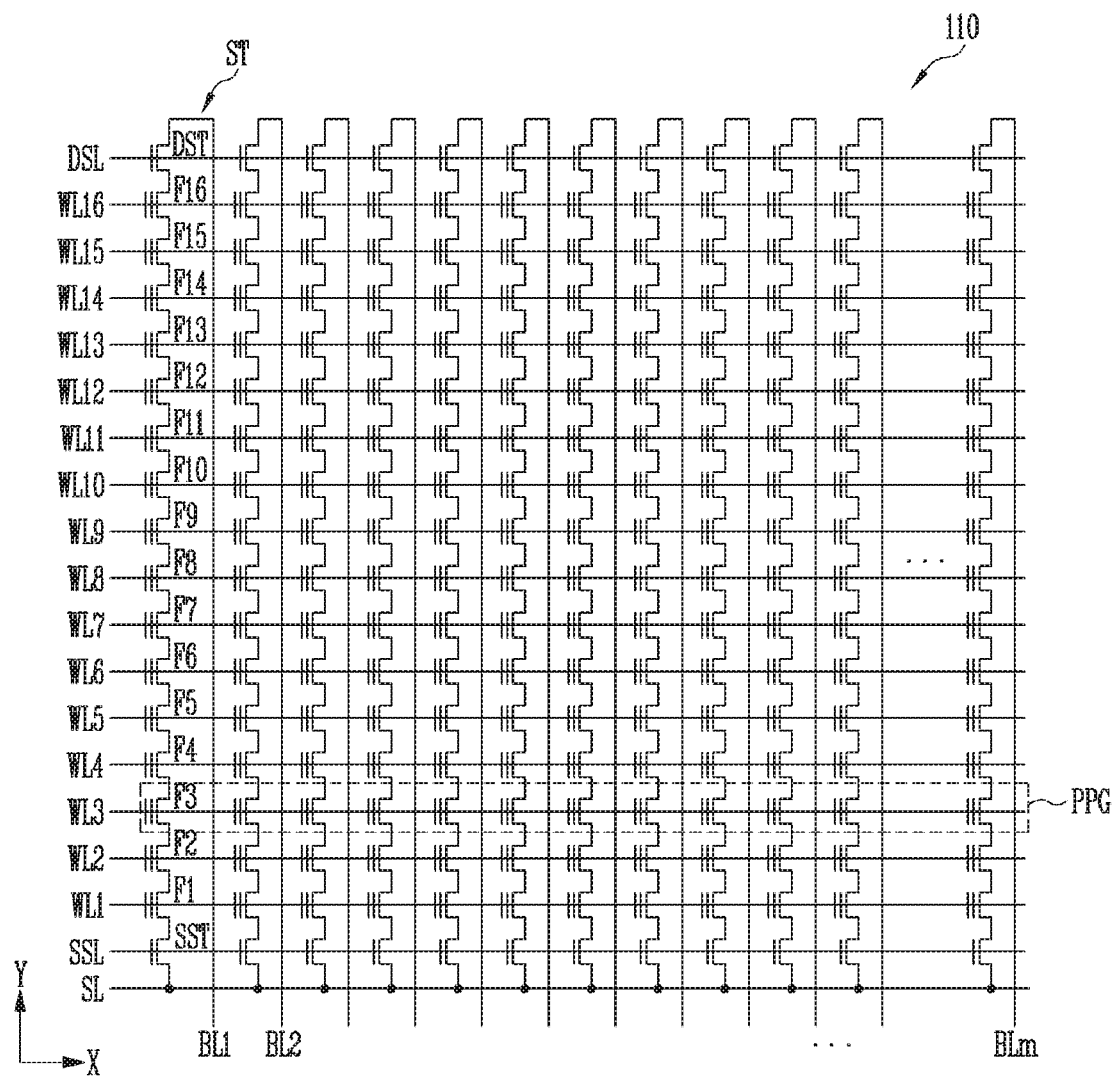
FIG. 3 is a diagram illustrating a memory block of a memory device in accordance with an embodiment of the present disclosure.

FIG. 3 is a diagram illustrating a memory block, e.g., memory block 110 of FIG. 2, in accordance with an embodiment of the present disclosure.

Referring to FIG. 3, in the memory block 110, a plurality of word lines arranged parallel to each other may be coupled between a first select line and a second select line. Here, the first select line may be a source select line SSL, and the second select line may be a drain select line DSL. In more detail, the memory block 110 may include a plurality of strings ST coupled between the bit lines BL1 to BLm and the source line SL. The bit lines BL1 to BLm may be respectively coupled to the strings ST, and the source lines SL may be coupled in common to the strings ST. The strings ST may have the same configuration; therefore, the string ST that is coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST, and more than the 16 memory cells F1 to F16 shown in the drawing may be included in each string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST in different strings ST may be coupled to the source select line SSL. Gates of the drain select transistors DST may be coupled to the drain select line DSL. Gates of the memory cells F1 to F16 may be coupled to the plurality of word lines WL1 to WL16. Among the memory cells in different strings ST, a group of memory cells coupled to each word line may be referred to as a physical page PPG. Therefore, the number of physical pages PPG in the memory block 110 may correspond to the number of word lines WL1 to WL16.

Each memory cell may store 1 bit of data. This memory cell is typically called a single level cell SLC. In this case, each physical page PPG may store data of a single logical page LPG. Data of each logical page LPG may include data bits corresponding to the number of cells in a single physical page PPG. Each memory cell may store 2 or more bits of data. This memory cell is typically called a multi-level cell MLC. In this case, each physical page PPG may store data of two or more logical pages LPG.

Figure 4:
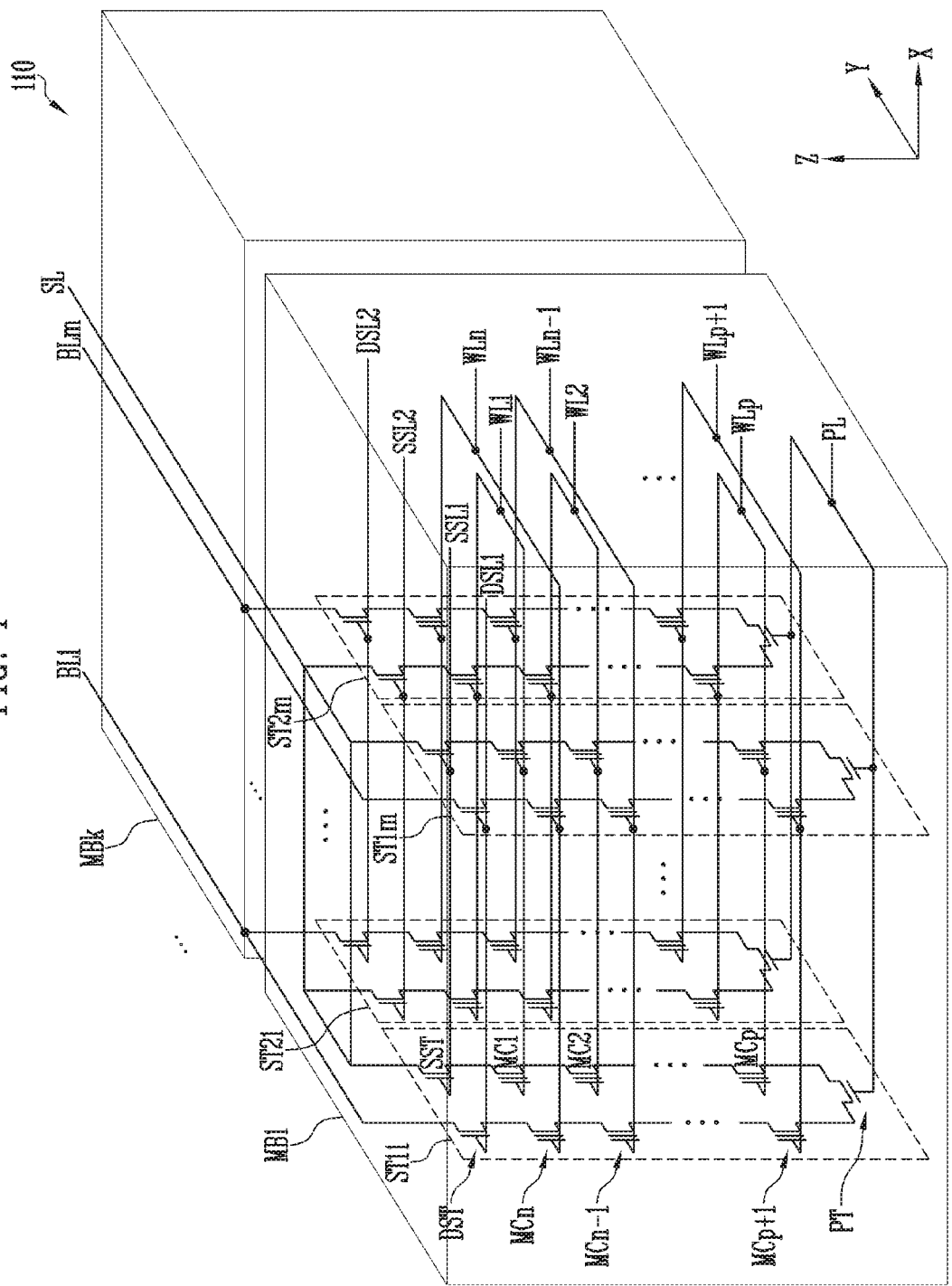
FIG. 4 is a diagram illustrating a memory block having a three-dimensional structure in accordance with an embodiment of the present disclosure.

FIG. 4 is a diagram illustrating a memory block 110 having a three-dimensional structure in accordance with an embodiment of the present disclosure.

Referring to FIG. 4, the memory cell array 100 may include a plurality of memory blocks MB1 to MBk 110. Each memory block 110 may include a plurality of strings ST11 to ST1m and ST21 to ST2m. In an embodiment, each of the strings ST11 to ST1m and ST21 to ST2m may be formed in a 'U' shape. In the first memory block MB1, m strings may be arranged in a row direction (i.e., an X direction). FIG. 4 illustrates by way of example two strings arranged in a column direction (i.e., a Y direction). In another embodiment, however, three or more strings may be arranged in the column direction.

Each of the plurality of strings ST11 to ST1m and ST21 to ST2m may include at least one source select transistor SST, first to n-th memory cells MC1 to MCn, a pipe transistor PT, and at least one drain select transistor DST.

The source and the drain select transistors SST and DST and the memory cells MC1 to MCn may have structures similar to each other. For example, each of the source and the drain select transistors SST and DST and the memory cells MC1 to MCn may include a channel layer, a tunnel insulating layer, a charge trap layer, and a blocking insulating layer. For example, a pillar for providing the channel layer may be provided in each string. In an embodiment, a pillar for providing at least one of the channel layer, the tunnel insulating layer, the charge trap layer, and the blocking insulating layer may be provided in each string.

The source select transistor SST of each string may be coupled between the source line SL and the memory cells MC1 to MCn.

In an embodiment, source select transistors of strings arranged in the same row may be coupled to a source select line extending in the row direction. Source select transistors of strings arranged in different rows may be coupled to different source select lines. In FIG. 4, source select transistors of the strings ST11 to ST1m in a first row may be coupled to a first source select line SSL1. Source select transistors of the strings ST21 to ST2m in a second row may be coupled to a second source select line SSL2.

In an embodiment, the source select transistors of the strings ST11 to ST1m and ST21 to ST2m may be coupled in common to a single source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be successively arranged in a vertical direction (i.e., in a Z direction) and coupled in series to each other between the source select transistor SST and the pipe transistor PT. The (p+1)-th to n-th memory cells MCp+1 to MCn may be successively arranged in the vertical direction (the Z direction) and coupled in series to each other between the pipe transistor PT and the drain select transistor DST. The first to p-th memory cells MC1 to MCp and the (p+1)-th to n-th memory cells MCp+1 to MCn may be coupled to each other through the pipe transistor PT. Gates of the first to n-th memory cells MC1 to MCn of each string may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to corresponding drain select lines extending in the row direction. The drain select transistors of the strings ST11 to ST1m in the first row may be coupled to a first drain select line DSL1. The drain select transistors of the strings ST21 to ST2m in the second row may be coupled to a second drain select line DSL2.

Strings arranged in the column direction may be coupled to corresponding bit lines extending in the column direction. In FIG. 4, the strings ST11 and ST21 in a first column ay be coupled to a first bit line BL1. The strings ST1m and ST2m in an m-th column may be coupled to an m-th bit line BLm.

Among the strings arranged in the row direction, memory cells coupled to the same word line may form one page. For example, memory cells coupled to the first word line WL1 in the strings ST11 to ST1m of the first row may form a single page. Memory cells coupled to the first word line WL1 in the strings ST21 to ST2m of the second row may form another single page. When any one of the drain select lines DSL1 and DSL2 is selected, strings arranged in the corresponding row may be selected. When any one of the word lines WL1 to WLn is selected, a corresponding single page may be selected from the selected strings.

Figure 5:
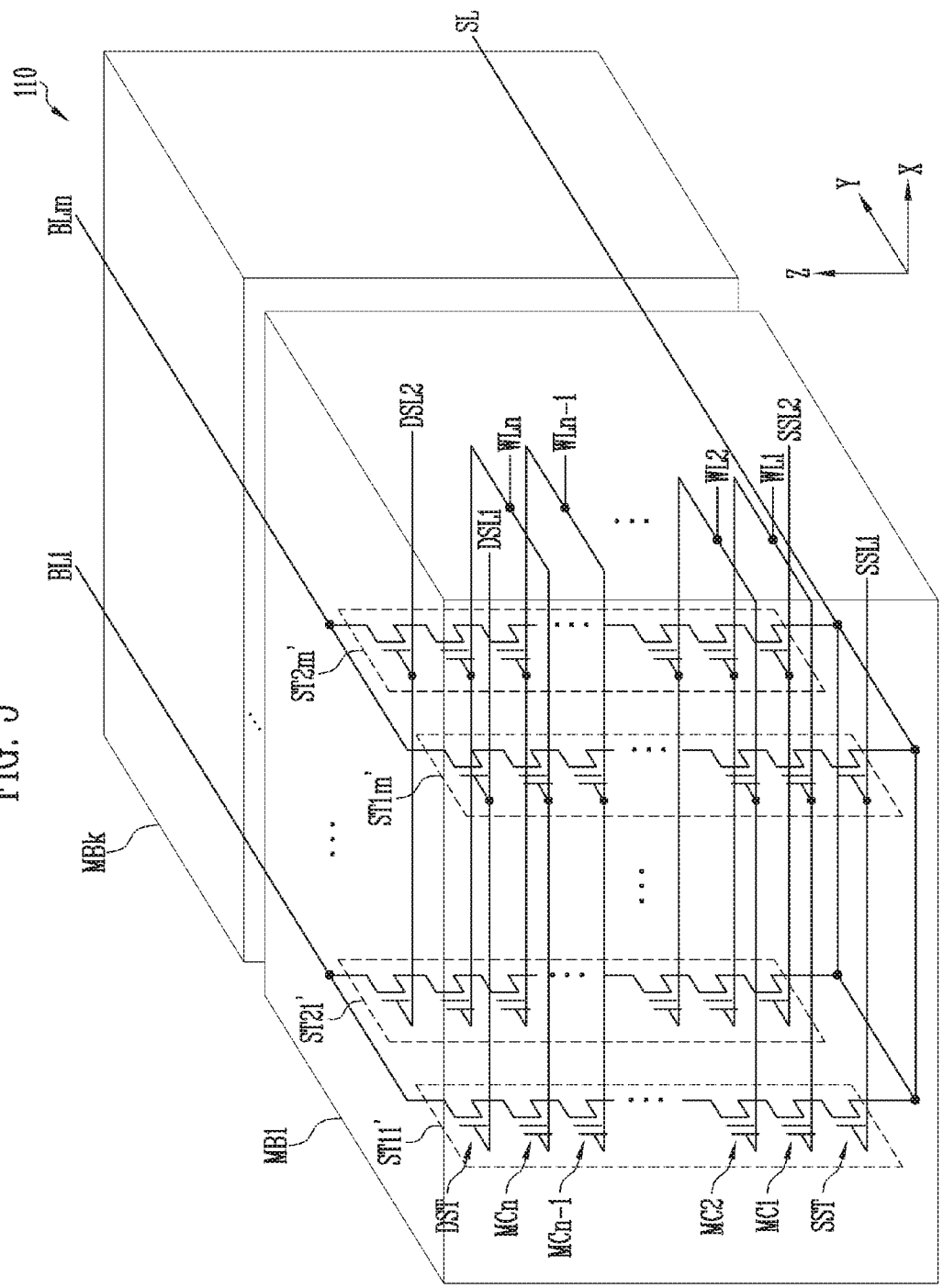
FIG. 5 is a diagram illustrating a memory block having a three-dimensional structure in accordance with an embodiment of the present disclosure.

FIG. 5 is a diagram illustrating a memory block 110 having a three-dimensional structure in accordance with an embodiment of the present disclosure.

Referring to FIG. 5, the memory cell array 100 may include a plurality of memory blocks MB1 to MBk 110. Each memory block 110 may include a plurality of strings ST11' to ST1m' and ST21° to ST2m'. Each of the strings ST11' to ST1m' and ST21' to ST2m' may extend in a vertical direction (i.e., in a Z direction). In each memory block 110, strings may be arranged in a row direction (i.e., in an X direction). FIG. 5 illustrates by way of example two strings arranged in a column direction (i.e., in a Y direction). In another embodiment, however, three or more strings may be arranged in the column direction.

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to a single source select line.

The first to n-th memory cells MC1 to MCn in each string may be coupled in series between the source select transistor SST and the drain select transistor DST. Gates of the first to n-th memory cells MC1 to MCn may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. Thereby, the reliability of data stored in each memory block 110 may be improved.

The drain select transistor DST of each string may be coupled between the corresponding bit line and the memory cells MC1 to MCn. Drain select transistors DST of strings arranged in the row direction may be coupled to corresponding drain select lines extending in the row direction. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

The source select transistors SST, the drain select transistors DST, and the pipe transistors PT that are shown in FIGS. 3 to 5 may be programmed to have constant threshold voltages, and threshold voltage distributions thereof may be changed to allow the overall operations of the memory device to be performed. Hence, when a problem occurs in turning on/off the source select transistors SST, the drain select transistors DST, or the pipe transistors PT by applying an operating voltage thereto, a program status fail or read disturb phenomenon may be caused.

Figure 6:
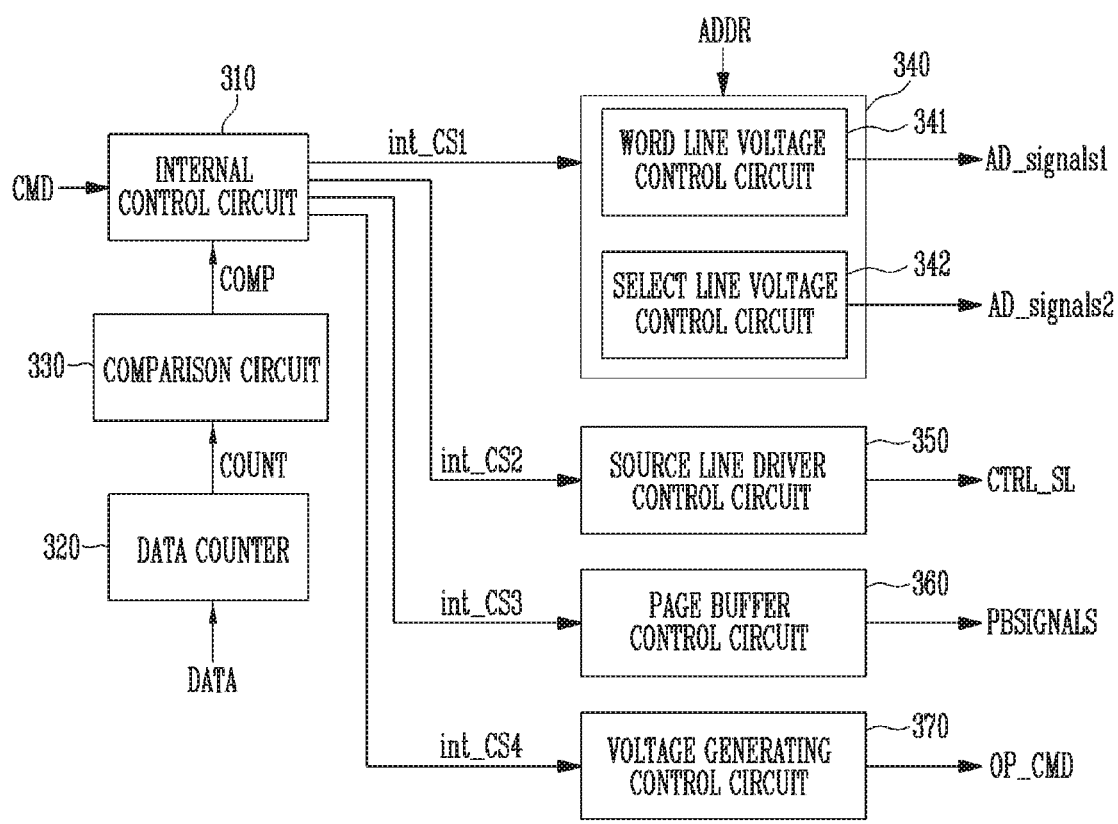
FIG. 6 is a block diagram illustrating control logic of a memory device in accordance with an embodiment of the present disclosure.

FIG. 6 is a block diagram illustrating control logic, e.g., the control logic 300 of the memory device 1100 in FIG. 2, in accordance with an embodiment of the present disclosure.

Referring to FIG. 6, the control logic 300 may include an internal control circuit 310, a data counter 320, a comparison circuit 330, a row decoder control circuit 340, a source line driver control circuit 350, a page buffer control circuit 360, and a voltage generating control circuit 370.

The internal control circuit 310 may include a read only memory (ROM). An algorithm for performing various overall operations (e.g., a program operation, a read operation, and an erase operation) of the memory device 1100 may be stored in the ROM. The internal control circuit 310 may generate and output a plurality of internal control signals int_CS1 to int_CS4 in response to a command CMD and a comparison signal COMP.

During an operation of monitoring the threshold voltages of the select transistors, the data counter 320 may count the number of pieces of specific data (e.g., 1 or 0) of data DATA received from the input/output circuit 250 of FIG. 2. Further, the data counter 320 may generate and output a count signal COUNT corresponding to the counted number.

The comparison circuit 330 may determine whether the counted number of pieces of specific data is in a first setting range or a second setting range based on the count signal COUNT. Further, the comparison circuit 330 may output a corresponding comparison signal COMP based on the determination result.

The row decoder control circuit 340 may generate and output row decoder control signals AD_signals1 and AD_signals2 for controlling the row decoder 220 of FIG. 2 in response to the internal control signal int_CS1 outputted from the internal control circuit 310.

The row decoder control circuit 340 may include a word line voltage control circuit 341 and a select line voltage control circuit 342.

The word line voltage control circuit 341 may generate and output the row decoder control signals AD_signals1 in response to the internal control signal int_CS1. In an embodiment, the row decoder control signals AD_signals1 may control the row decoder 220 (of FIG. 2) to selectively apply operating voltages (e.g., a program voltage, a verify voltage, and a pass voltage) generated from the voltage generating circuit 210 of FIG. 2 to the word lines of the local lines LL.

The select line voltage control circuit 342 may generate and output the row decoder control signals AD_signals2 in response to the internal control signal int_CS1. In an embodiment, the row decoder control signals AD_signals2 may control the row decoder (220 (of FIG. 2) to selectively apply select transistor operating voltages generated form the voltage generating circuit (210 (of FIG. 2) to the source select lines, the drain select lines, and the pipe line of the local lines LL.

The source line driver control circuit 350 may generate and output a source line control signal CTRL_SL for controlling the source line driver 270 of FIG. 2 in response to the internal control signal int_CS2 outputted from the internal control circuit 310. In an embodiment, the source line control signal CTRL_SL may control the source line driver 270 (of FIG. 2) to apply a source line voltage to the source line of the memory cell array 100.

The page buffer control circuit 360 may generate and output page buffer control signals PBSIGNALS for controlling the page buffer group 230 of FIG. 2 in response to the internal control signal int_CS3 outputted from the internal control circuit 310.

The voltage generating control circuit 370 may generate and output an operating signal OP_CMD for controlling the voltage generating circuit 210 of FIG. 2 in response to the internal control signal int_CS4 outputted from the internal control circuit 310. Furthermore, the voltage generating control circuit 370 may generate a select transistor operating voltage adjusted in potential level in response to the internal control signal int_CS4.

Figure 7:
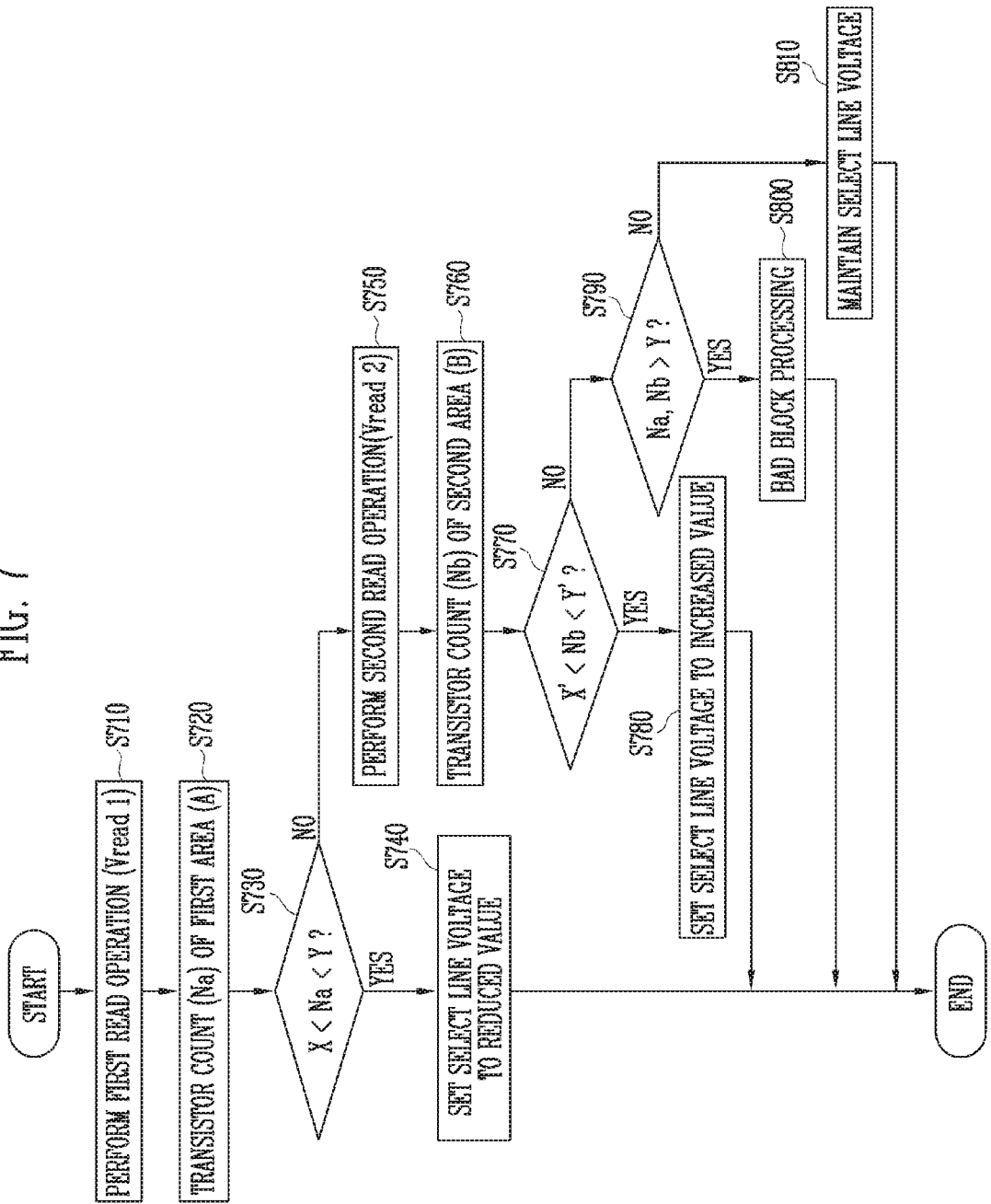
FIG. 7 is a flowchart illustrating a program operation of a memory device in accordance with an embodiment of the present disclosure.

FIG. 7 is a flowchart illustrating an operation of a memory device in accordance with an embodiment of the present disclosure.

Figure 8:
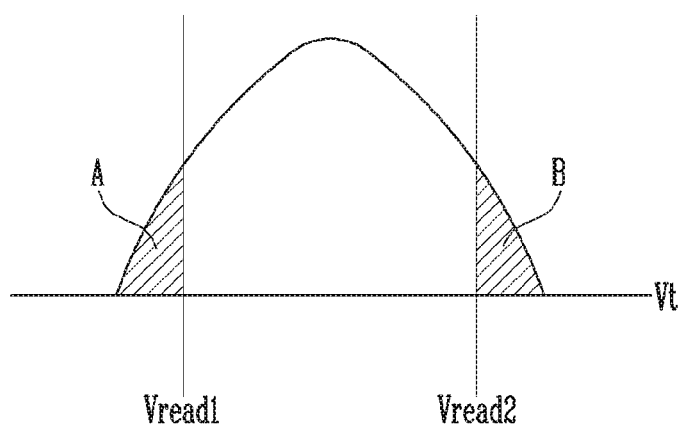
FIG. 8 is a threshold voltage distribution diagram illustrating a method of monitoring a threshold voltage distribution of select transistors in accordance with an embodiment of the present disclosure.

FIG. 8 is a threshold voltage distribution diagram illustrating a method of monitoring a threshold voltage distribution of the select transistors in accordance with an embodiment of the present disclosure.

The method of monitoring the threshold voltage distribution of the select transistors of the memory device in accordance with an embodiment of the present disclosure will be described primarily with reference to FIGS. 7 and 8, and secondarily with reference to the other figures.

In this embodiment, a method of monitoring the threshold voltage distribution of the drain select transistors DST and setting a select transistor operating voltage to be applied to the drain select line DSL will be described by way of example.

Referring to FIG. 7, at step S710, the control logic 300 controls the peripheral circuit 200 to perform a read operation using a first read voltage Vread1 on the drain select transistors DST.

The voltage generating circuit 210 generates a first read voltage Vread1, a pass voltage, and a select transistor operating voltage in response to an operating signal OP_CMD. The row decoder 220 applies the first read voltage Vread1, the pass voltage, the source select transistor voltage, and the pipe transistor voltage to the drain select line DSL, the word lines WL1 to WLn, the source select line SSL, and the pipe A, line PL of a selected memory block, in response to row decoder control signals AD_signals1 and AD_signals2. For example, the row decoder 220 may apply the pass voltage generated from the voltage generating circuit 210 to the word lines WL1 to WLn in response to the row decoder control signal AD_signals1. Further, the row decoder 220 may apply the first read voltage Vread1 generated from the voltage generating circuit 210 to the drain select line DSL in response to the row decoder control signals AD_signals2, and may apply the source select transistor operation voltage and the pipe transistor operating voltage generated from the voltage generating circuit 210 to the source select line SSL and the pipe line PL respectively, in response to the row decoder control signals AD_signals2.

The page buffers PB1 to PBm 231 of the page buffer group 230 sense voltage or current of the bit lines BL1 to BLm in response to page buffer control signals PBSIGNALS. Thereby, the page buffers PB1 to PBm may store data corresponding to the threshold voltage of the drain select transistor. For example, each of the page buffers PB1 to PBm may latch first data (e.g., "0") if the threshold voltage of the corresponding drain select transistor is greater than the first read voltage Vread1, and may latch second data (e.g., "1") if the threshold voltage of the corresponding drain select transistor is less than the first read voltage Vread1.

At step S720, the control logic 300 receives data DATA latched by the page buffer group 230 as a result of the first read operation, and counts the number of drain select transistors having threshold voltages corresponding to a first area A (Na) according to the received data DATA. As shown in FIG. 8, the first area A may be defined as a lower threshold voltage distribution area.

The data DATA latched by the page buffer group 230 is transmitted to the data counter 320 of the control logic 300 through the column decoder 240 and the input/output circuit 250. The data counter 320 counts the number (Na) of drain select transistors having threshold voltages corresponding to the first area A by counting the number of pieces of second data ("1") among the received data DATA. Further, the data counter 320 outputs a corresponding count signal COUNT.

At step S730, the comparison circuit 330 of the control logic 300 determines whether the number (Na) falls within the first setting range (X to Y) in response to the count signal COUNT. Further, the comparison circuit 330 outputs a comparison signal COMP based on a result of the determination.

As a result of the comparison operation of the comparison circuit 330, when the number (Na) falls within the first setting range (X to Y), as shown by "YES" of S730, the internal control circuit 310 sets the drain select line operating voltage to a value less than an initial setting potential level, in response to the comparison signal COMP, at step S740.

As a result of the comparison operation of the comparison circuit 330, when the number (Na) does not fall within the first setting range (X to Y), as shown by "NO" of S730, the control logic 300 controls the peripheral circuit 200 to perform a read operation using the second read voltage Vread2 on the drain select transistors DST at step S750.

The voltage generating circuit 210 generates a second read voltage Vread2, a pass voltage, and a select transistor operating voltage in response to an operating signal OP_CMD. The row decoder 220 applies the second read voltage Vread2, the pass voltage, the source select transistor voltage, and the pipe transistor voltage to the drain select line DSL, the word lines WL1 to WLn, the source select line SSL, and the pipe line PL of a selected memory block, in response to row decoder control signals AD_signals1 and AD_signals2. For example, the row decoder 220 may apply the pass voltage to the word lines WL1 to WLn in response to the row decoder control signal AD_signals1, may apply the second read voltage Vread2 to the drain select line DSL in response to the row decoder control signals AD_signals2, and may apply the source select transistor operation voltage and the pipe transistor operating voltage to the source select line SSL and the pipe line PL respectively, in response to the row decoder control signals AD_signals2.

The page buffers PB1 to PBm 231 of the page buffer group 230 sense voltage or current of the bit lines BL1 to BLm in response to page buffer control signals PBSIGNALS. Thereby, the page buffers PB1 to PBm may store data corresponding to the threshold voltage of the drain select transistor. For example, each of the page buffers PB1 to PBm may latch first data (e.g., "0") if the threshold voltage of the corresponding drain select transistor is greater than the second read voltage Vread2, and may latch second data (e.g., "1") if the threshold voltage of the corresponding drain select transistor is less than the second read voltage Vread2.

At step S760, the control logic 300 receives data DATA latched by the page buffer group 230 as a result of the second read operation, and counts the number of drain select transistors having threshold voltages corresponding to a second area B (Nb) according to the received data DATA. As shown in FIG. 8, the second area B may be defined as an upper threshold voltage distribution area.

The data DATA latched by the page buffer group 230 is transmitted to the data counter 320 of the control logic 300 through the column decoder 240 and the input/output circuit 250. The data counter 320 counts the number (Nb) by counting the number of pieces of first data ("0") among the received data DATA. Further, the data counter 320 outputs a corresponding count signal count.

At step S770, the comparison circuit 330 of the control logic 300 determines whether the number (Nb) falls within a second setting range (X' to Y') in response to the count signal COUNT. Further, the comparison circuit 330 outputs a comparison signal COMP based on a result of the determination.

As a result of the comparison operation of the comparison circuit 330, when the number (Nb) falls within the second setting range (X' to Y'), as shown by "YES" of S770, the internal control circuit 310 sets the drain select line operating voltage to a value greater than the initial setting potential level, in response to the comparison signal COMP, at step S780.

As a result of the comparison operation of the comparison circuit 330, when the number (Nb) does not fall within the second setting range (X' to Y'), as shown by "NO" of S770, the comparison circuit 330 compares the number (Na) or the number (Nb) with the first setting range, Y, at step S790.

As a result of the comparison operation S790, when the number (Na) or the number (Nb) exceeds the first setting range (Y), as shown by "YES" of S790, at step S800, the control logic 300 determines the selected memory block to be a bad block by determining that the drain select transistors in the selected memory block are defective. Further, the control logic 300 outputs bad block information to the bad block management component 1210.

Alternatively, as a result of the comparison operation S790, when the number (Na) or the number (Nb) is less than the first setting range (Y), as shown by "NO" of S790, at step S810, the control logic 300 determines that the threshold voltage distribution of the drain select transistors in the selected memory block is normal. Further, the control logic 300 maintains the potential level of the drain select transistor operating voltage at the initial setting potential level.

In this embodiment, the threshold voltage distribution of the drain select transistors is monitored and the drain select transistor operating voltage is set based on a result of the monitoring. However, the present invention is not limited those specifics; in another embodiment, the threshold voltage distribution of the source select transistors or the pipe transistors may be monitored, and the source select transistor operating voltage or the pipe transistor operating voltage may be set based on a result of the monitoring.

The operation of setting the select transistor operating voltage of the memory device may be performed before an overall operation, e.g., a program operation or a read operation, of the memory device. In other words, based on a result of the operation of monitoring the threshold voltages of the select transistors in the selected memory block, operating voltages of the select transistors may be set, and thereafter the overall operation such as a program operation or a read operation may be performed using the set operating voltages of the select transistors.

Figure 9:
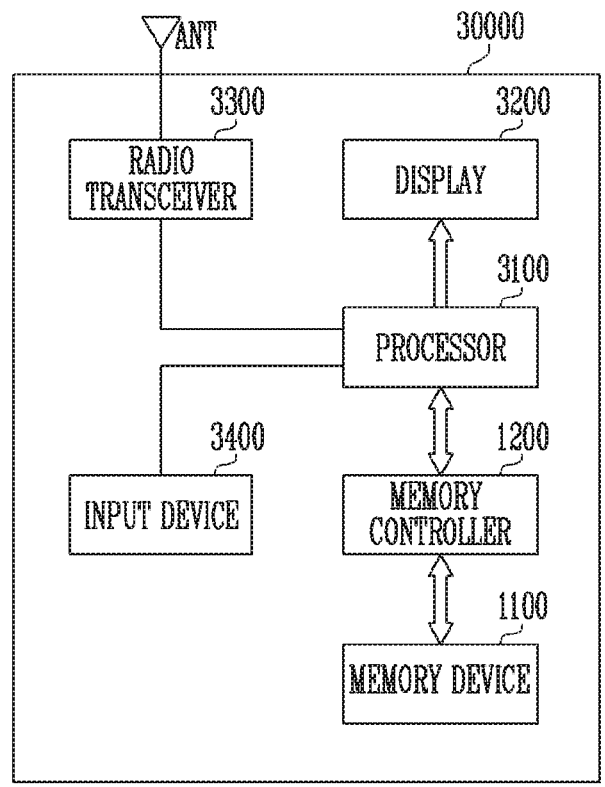
FIG. 9 is a diagram illustrating a memory system in accordance with an embodiment of the present disclosure.

FIG. 9 is a diagram illustrating a memory system 30000 in accordance with an embodiment of the present disclosure.

Referring to FIG. 9, the memory system 30000 may be embodied in a cellular phone, a smartphone, a tablet personal computer (PC), a personal digital assistant (PDA) or a wireless communication device. The memory system 30000 may include a memory device 1100, and a memory controller 1200 configured to control the operation of the memory device 1100. The memory controller 1200 may control a data access operation, e.g., a program operation, an erase operation, or a read operation, of the memory device 1100 under control of a processor 3100.

Data programmed in the memory device 1100 may be outputted through a display 3200 under control of the memory controller 1200.

A radio transceiver 3300 may transmit and receive radio signals through an antenna ANT. For example, the radio transceiver 3300 may convert a radio signal received through the antenna ANT into a signal capable of being processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may convert a signal output from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data output from the memory controller 1200, data output from the radio transceiver 3300, or data outputted form the input device 3400 is output through the display 3200.

In an embodiment, the memory controller 1200 capable of controlling the operation of the memory device 1100 may be embodied as a part of the processor 3100 or a chip provided separately from the processor 3100. The memory controller 1200 may be implemented using the example of the controller 1200 shown in FIG. 2.

Figure 10:
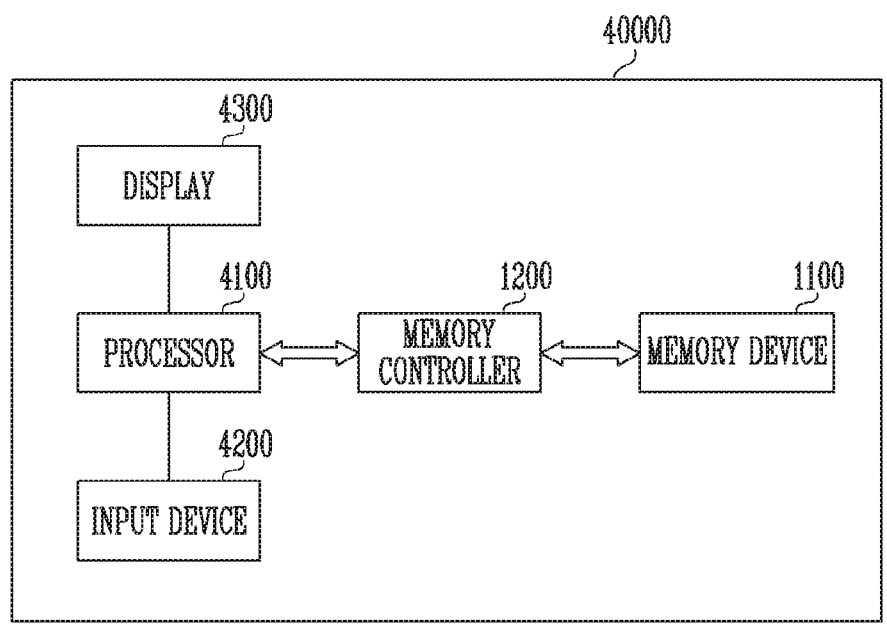
FIG. 10 is a diagram illustrating a memory system in accordance with an embodiment of the present disclosure.

FIG. 10 is a diagram illustrating a memory system 40000 in accordance with an embodiment of the present disclosure.

Referring to FIG. 10, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 1100, and a memory controller 1200 configured to control the data processing operation of the memory device 1100.

A processor 4100 may output data stored in the memory device 1100 through a display 4300, according to data inputted from an input device 4200. For example, the input device 4200 may be embodied in a pointing device such as a touch pad or a computer mouse, a keypad, or a keyboard.

The processor 4100 may control the overall operation of the memory system 40000 and control the operation of the memory controller 1200. In an embodiment, the memory controller 1200 capable of controlling the operation of the memory device 1100 may be embodied as a part of the processor 4100 or a chip provided separately from the processor 4100. The memory controller 1200 may be implemented using the example of the controller 1200 shown in FIG. 2.

Figure 11:
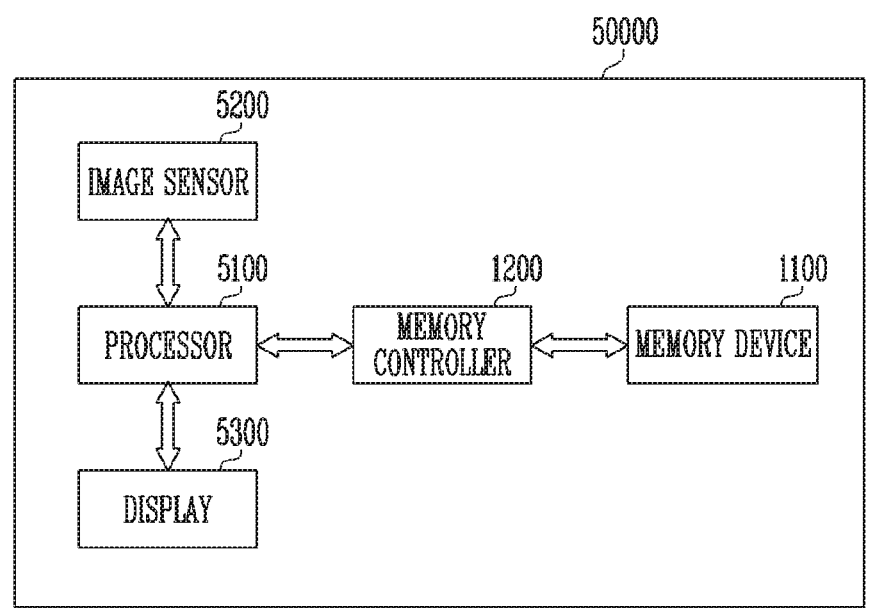
FIG. 11 is a diagram illustrating a memory system in accordance with an embodiment of the present disclosure.

FIG. 11 is a diagram illustrating a memory system 50000 in accordance with an embodiment of the present disclosure.

Referring to FIG. 11, the memory system 50000 may be embodied in an image processing device, e.g., a digital camera, a portable phone provided with a digital camera, a smartphone provided with a digital camera, or a tablet personal computer (PC) provided with a digital camera.

The memory system 50000 may include the memory device 1100, and a memory controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be outputted through a display 5300 or stored in the memory device 1100 through the controller 1200. Data stored in the memory device 1100 may be outputted through the display 5300 under control of the processor 5100 or the memory controller 1200.

In an embodiment, the memory controller 1200 capable of controlling the operation of the memory device 1100 may be embodied as a part of the processor 5100 or a chip provided separately from the processor 5100. The memory controller 1200 may be implemented using the example of the controller 1200 shown in FIG. 2.

Figure 12:
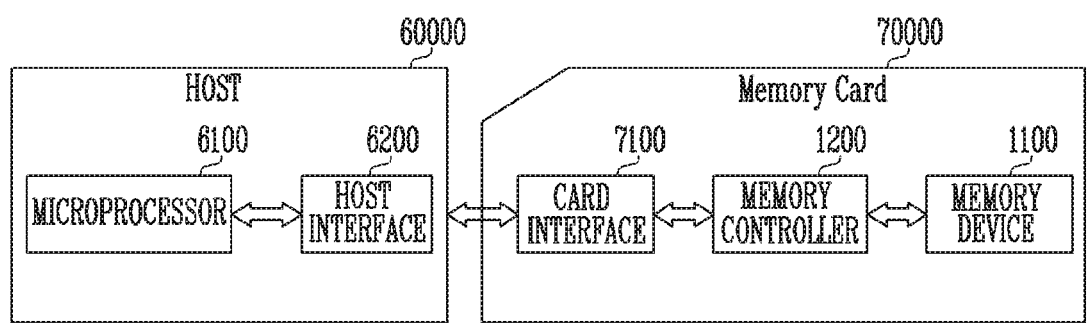
FIG. 12 is a diagram illustrating a memory system in accordance with an embodiment of the present disclosure.

FIG. 12 is a diagram illustrating a memory system 70000 in accordance with an embodiment of the present disclosure.

Referring to FIG. 12, the memory system 70000 may be embodied in a memory card or a smart card. The memory system 70000 may include a memory device 1100, a memory controller 1200, and a card interface 7100.

The controller 1200 may control data exchange between the memory device 1100 and the card interface 7100. In an embodiment, the card interface 7100 may be a secure digital (SD) card interface or a multi-media card (MMC) interface, but it is not limited thereto. The memory controller 1200 may be implemented using the example of the controller 1200 shown in FIG. 2.

The card interface 7100 may interface data exchange between a host 60000 and the memory controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed in the hardware, or a signal transmission scheme.

When the memory system 70000 is connected to a host interface 6200 of the host 60000 such as a personal computer (PC), a tablet PC, a digital camera, a digital audio player, a cellular phone, console video game hardware or a digital set-top box, the host interface 6200 may perform data communication with the memory device 1100 through the card interface 7100 and the memory controller 1200 under control of a microprocessor 6100.

In the above-discussed embodiments, all steps may be selectively performed or skipped. In addition, the steps in each embodiment may not be always performed in regular order. Furthermore, the embodiments disclosed in the present specification and the drawings aims to help those skilled in this art more clearly understand the present disclosure not to limit the bounds of the present disclosure. In other words, those skilled in the art to which the present disclosure belongs will be able to easily understand that various modifications are possible based on the technical scope of the present disclosure.

As described above, a memory device in accordance with an embodiment of the present disclosure may monitor threshold voltages of select transistors in a selected memory block before a program operation or a read operation of the memory device, and adjust and set an operating voltage for operating the select transistors based on a result of the monitoring. Therefore, during the program operation and the read operation, a program status fail or read disturb phenomenon may be mitigated.

Various embodiments have been illustrated and described herein, and although specific terms are employed, they are used and are to be interpreted in a generic and descriptive sense and not for purpose of limitation. In some instances, as would be apparent to those skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details, including modifications, additions and substitutions, may be made without departing from the spirit and scope of the present disclosure as set forth in the following claims. The present invention encompasses all such changes that fall within the scope of the claims and their equivalents.

What is claimed is:

1. A memory device comprising:
 a memory block including a plurality of memory cells and a plurality of select transistors;
 a peripheral circuit configured to perform a program operation and a read operation on the plurality of memory cells, and perform a threshold voltage monitoring operation on the plurality of select transistors; and
 control logic configured to control the peripheral circuit to perform the program operation and the read operation, and the threshold voltage monitoring operation,
 wherein, based on a result of the threshold voltage monitoring operation, a potential level of a select transistor operating voltage for turning on the plurality of select transistors is set to be lower or higher than an initial setting potential level during the program operation or the read operation on the plurality of memory cells, wherein the peripheral circuit includes a page buffer group coupled with the plurality of select transistors, and configured to sense first data or second data depending on threshold voltages of the selected transistors and output the sensed first data or the sensed second data, and wherein the control logic comprises:
- a data counter configured to count a number of pieces of first data or second data outputted from the page buffer group;
- a comparison circuit configured to determine whether the number of pieces of first data counted by the data counter falls within a first setting range or the number of pieces of second data counted by the data counter falls within a second setting range, and output a comparison signal based on a result of the determination; and
- an internal control circuit configured to adjust and set the potential level of the select transistor operating voltage in response to the comparison signal.

2. The memory device of claim 1, wherein the plurality of select transistors includes at least one of a plurality of drain select transistors and a plurality of source select transistors.

3. The memory device of claim 2, wherein the plurality of select transistors further includes pipe transistors.

4. The memory device of claim 1, wherein the peripheral circuit further includes:
- a voltage generating circuit configured to generate and output a first read voltage and a second read voltage greater than the first read voltage during the threshold voltage monitoring operation; and
- a row decoder configured to apply the first read voltage or the second read voltage to transistors selected from among the plurality of select transistors.

5. The memory device of claim 1, wherein the control logic determines a number of the selected transistors in a lower threshold voltage distribution area depending on the number of pieces of first data read based on a result of a first read operation during the threshold voltage monitoring operation.

6. The memory device of claim 5, wherein, when the number of selected transistors in the lower threshold voltage distribution area is in a first setting range, the potential level of the select transistor operating voltage to be applied to the selected transistors is reduced.

7. The memory device of claim 1, wherein the control logic determines a number of the selected transistors in an upper threshold voltage distribution area depending on the number of pieces of second data read based on a result of a second read operation during the threshold voltage monitoring operation.

8. The memory device of claim 7, wherein, when the number of the selected transistors in the upper threshold voltage distribution area is in a second setting range, the potential level of the select transistor operating voltage is increased.

9. The memory device of claim 1, wherein, during the threshold voltage monitoring operation, the control logic determines the memory block to be a bad block when the number of pieces of first data read based on a result of a first read operation or the number of pieces of second data read based on a result of a second read operation exceeds a set number.

10. A memory device comprising:
- a memory block including a plurality of memory cells and a plurality of select transistors;
- a peripheral circuit configured to perform a program operation and a read operation on the plurality of memory cells and perform a threshold voltage monitoring operation on the plurality of select transistors; and
- a control logic configured to:
- control the peripheral circuit;
- set a select transistor operating voltage for turning on the plurality of select transistors to be lower than an initial setting potential level during the program operation or the read operation on the plurality of memory cells when, as a result of the threshold voltage monitoring operation, a number of first select transistors included in a lower threshold voltage distribution, among the plurality of select transistors, falls within a first setting range; and
- set the select line select transistor operating voltage to be higher than the initial setting potential level when a number of second select transistors included in an upper threshold voltage distribution, among the plurality of select transistors, falls within a second setting range, wherein the control logic comprises:
- a data counter configured to count a number of pieces of first data or second data outputted from the page buffer group;
- a comparison circuit configured to determine whether the number of pieces of first data counted by the data counter falls within the first setting range or the number of pieces of second data counted by the data counter falls within the second setting range, and output a comparison signal based on a result of the determination; and
- an internal control circuit configured to adjust and set a potential level of the select transistor operating voltage line in response to the comparison signal.

11. The memory device of claim 10, wherein the plurality of select transistors includes at least one of a plurality of drain select transistors, a plurality of source select transistors, and a plurality of pipe transistors.

12. The memory device of claim 10, wherein the peripheral circuit includes:
- a voltage generating circuit configured to generate and output a first read voltage and a second read voltage greater than the first read voltage during the threshold voltage monitoring operation;
- a row decoder configured to apply the first read voltage or the second read voltage to select transistors selected from among the plurality of select transistors; and
- a page buffer group configured to sense the first data or the second data depending on threshold voltages of the selected select transistors and output the sensed first data or the sensed second data.

* * * * *